United States Patent [19]

Tsuji et al.

[11] Patent Number: 5,521,432
[45] Date of Patent: May 28, 1996

[54] SEMICONDUCTOR DEVICE HAVING IMPROVED LEADS COMPRISING PALLADIUM PLATED NICKEL

[75] Inventors: Kazuto Tsuji; Yoshiyuki Yoneda; Junichi Kasai; Michio Sono, all of Kawasaki, Japan

[73] Assignee: Fujitsu Limited, Kawasaki, Japan

[21] Appl. No.: 252,540

[22] Filed: Jun. 1, 1994

Related U.S. Application Data

[63] Continuation of Ser. No. 959,807, Oct. 13, 1992.

[30] Foreign Application Priority Data

Oct. 14, 1991 [JP] Japan ................. 3-264665

[51] Int. Cl.⁶ .............. H01L 23/495; H01L 23/48; H01L 23/52; H01L 29/40
[52] U.S. Cl. ............ 257/677; 257/766; 257/741; 257/768
[58] Field of Search ................. 257/670, 687, 257/766, 741, 768, 769, 666, 677, 735, 676; 428/670, 680

[56] References Cited

U.S. PATENT DOCUMENTS 4,785,137 11/1988 Samuels ................. 174/52
4,970,569 11/1990 Mori et al. ................. 257/677
4,977,442 12/1990 Suziki et al. ................. 357/70
5,032,895 7/1991 Horiuchi et al. ................. 357/72
5,066,550 11/1991 Horibe et al. ................. 428/670
5,175,609 12/1992 DiGiacomo et al. ................. 257/766
5,221,859 6/1993 Kobayashi et al. ................. 257/676

FOREIGN PATENT DOCUMENTS 3717246 11/1987 Germany ................. 257/677
2-42753 2/1990 Japan .
2-298056 12/1990 Japan .

OTHER PUBLICATIONS

07/874,916 Jun. 16, 1986 Casey (5,264,399) IBM.
07/174,060 Mar. 28, 1988 Abbott (FNC).
07/313,769 Aug. 22, 1989 McLellan (ABN5).

Primary Examiner—Rolf Hille
Assistant Examiner—T. M. Arroyo
Attorney, Agent, or Firm—Staas & Halsey

[57] ABSTRACT

A semiconductor device includes a semiconductor chip, a die-pad on which the semiconductor chip is mounted, a package encapsulating the die pad and the semiconductor chip, and a plurality of leads electrically connected to the semiconductor chip and projecting from the package, wherein each of the leads has a lead body made of pure nickel (Ni) having a purity equal to or greater than 99% and a first film formed thereon, the first film being made of palladium (Pd).

32 Claims, 7 Drawing Sheets

SEMICONDUCTOR DEVICE HAVING IMPROVED LEADS COMPRISING PALLADIUM PLATED NICKEL

This is a continuation of application Ser. No. 07/959,807, filed Oct. 13, 1992, now abandoned.

BACKGROUND OF THE INVENTION (1) Field of the Invention

The present invention generally relates to a semiconductor device having improved leads, and more particularly, to a semiconductor device having leads each provided with metal plating to be soldered to a circuit board with a high degree of solderability.

(2) Description of Related art

Recently, an increasing number of pins on a semiconductor device and miniaturization of a semiconductor device have become desirable. A semiconductor device having more than 300 pins (leads projecting from a package) arranged at 0.5 mm intervals, a semiconductor device having more than 100 pins arranged at 0.3 or 0.4 mm intervals and the like have been developed.

The leads of the semiconductor device are plated with conductive metal (e.g. solder) to be soldered to a circuit board with a high degree of solderability. In a miniaturized semiconductor device having a large number of pins, the accuracy of the thickness of the conductive metal with which the leads are plated affects the reliability of the semiconductor device.

Therefore, it is important to select the base metal of the leads and material of the plating conductive metal to be suitable for miniaturizing the semiconductor device and for improving the reliability of the semiconductor device.

In general, base metal of leads of a semiconductor device encapsulated by resin is made of either an iron-nickel (Fe—Ni) alloy (e.g. 42-alloy containing 42% nickel and 58% iron) or a copper (Cu) alloy, and the surface of the base metal is plated with solder so that the leads can be soldered to a circuit board with a high degree of solderability. The solder with which the base metal of the leads is plated must have a thickness equal to or more than 5 μm to obtain the required heat resistance property and durability and weatherability in the storage thereof. In addition, as the thickness of the solder with which the base metal of the leads are plated varies in accordance with conditions in the plating process, the solder on the base metal of the leads has a thickness in a range of 5–15 μm.

Due to the variation of the thickness of solder on the base metal of the leads, the accuracy of dimensions of the leads deteriorates. As a result, the reliability of the semiconductor device deteriorates also. That is, due to the variation of the thickness of the solder on the base metal of the leads, lead forming of the semiconductor device is not accurately performed. As a result, the leads are defectively soldered to a circuit board and adjacent leads are in contact with each other.

Recently, it has been noticed that the base metal of the leads may be plated with palladium (Pd) instead of the solder. The palladium having a thickness in a range of 0.1–1.5 μm has approximately the same characteristics as the solder.

Conventionally, leads in which a palladium film having a thickness in a range of 0.1–1.5 μm is formed on the base metal made of Fe—Ni alloy by a plating process have been proposed. However, when these leads underwent a salt spray test, red rust was generated on the surfaces of the leads. In a case where the red rust is generated on the surfaces of the leads, the leads are eaten away with the red rust, so that the reliability of the semiconductor device greatly deteriorates.

To prevent the red rust from appearing on the surfaces of the leads, the inventors have proposed leads in which a ground layer made of nickel (Ni) or tin-nickel (Sn—Ni) alloy is formed on the surface of the base metal made of Fe—Ni alloy and a palladium (Pd) film is formed thereon by the plating process. However, when these leads were applied with the salt spray test, red rust was generated on the surfaces of the leads in this case also. That is, the ground layer made of nickel (Ni) or tin-nickel (Sn—Ni) can not effectively prevent the red rust from appearing on the surfaces of the leads.

In a case where the base metal of the leads is made of copper alloy, to prevent thermal diffusion of the copper (Cu), a ground layer made of either nickel (Ni) or tin-nickel (Sn—Ni) alloy is formed on the surface of the base metal and palladium (Pd) having a thickness in a range of 0.1–1.5 μm is formed thereon by the plating process. In this case, the problem of the red rust generated on the surfaces of the leads is improved in some measure. However, although the resin package of the semiconductor devices has been improved so that the thermal expansion coefficient of the resin package reaches approximately $14 \times 10^{-6}$ /deg, the thermal expansion coefficient of the base metal made of the copper (Cu) alloy is approximately $18 \times 10^{-6}$ /deg. As a result, due to the difference between the above thermal expansion coefficients, when heating the semiconductor device, thermal stress is generated in the resin package. Due to the thermal stress in the resin package, a wire connecting the semiconductor chip to each lead breaks at positions at which the wire is in contact with each lead.

SUMMARY OF THE INVENTION

Accordingly, a general object of the present invention is to provide a semiconductor device in which the disadvantages of the aforementioned prior art are eliminated.

A more specific object of the present invention is to provide a semiconductor device in which the red rust is prevented from appearing on the surface of the leads in the salt spray test.

Another object of the present invention is to provide a semiconductor device in which thermal stress generated in the resin package is small.

A further object of the present invention is to provide a semiconductor device in which the reliability thereof is improved.

The above objects of the present invention are achieved by a semiconductor device comprising: a semiconductor chip; a die-pad on which the semiconductor chip is mounted; a package encapsulating the die pad and the semiconductor chip; and a plurality of leads electrically connected to the semiconductor chip and projecting from the package, wherein each of the leads has a lead body made of pure nickel (Ni) having a purity equal to or greater than 99% and a first film formed thereon, the first film being made of palladium (Pd).

According to the present invention, the lead body of each lead is made of pure nickel (Ni) and the film made of palladium (Pd) is formed on the lead body. Thus, the leads can be soldered to a circuit board with a high degree of solderability and the red rust can be prevented from occurring on the leads. In addition, the thermal expansion coefficient of the package can approximate that of pure nickel (Ni), so that the thermal stress generated in the package can become small. As a result, the reliability of the semiconductor device can be increased.

Additional objects, features and advantages of the present invention will become apparent from the following detailed description when read in conjunction with the accompanying drawings.

DESCRIPTION OF THE PREFERRED EMBODIMENTS

A description will now be given of a semiconductor device according to a first embodiment of the present invention with reference to FIG. 1.

Figure 1:
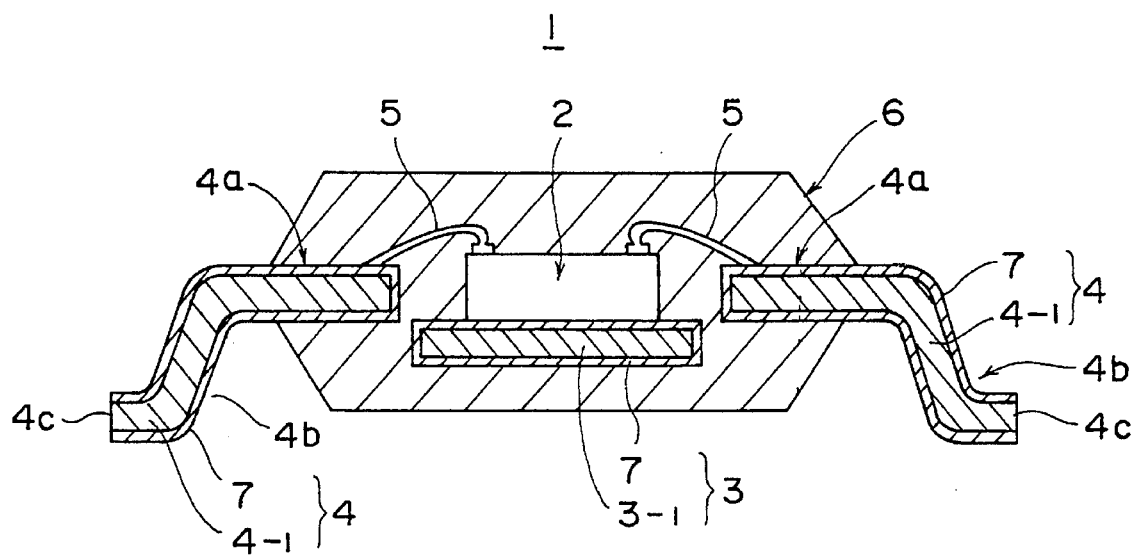
FIG. 1 is a cross sectional view illustrating a semiconductor device according to a first embodiment of the present invention.

Referring to FIG. 1, which is a cross sectional view showing the semiconductor device, a semiconductor chip 2 (e.g. LSI chip) is bonded on a die-pad 3, and leads 4 are provided at both sides of the die-pad 3. A first end of each of wires 5 is bonded on an electrode pad of the semiconductor chip 2 and a second end of each of the wires 5 is bonded on a corresponding one of the leads 4 so that the semiconductor chip 2 and the leads 4 are electrically connected to each other. The semiconductor chip 2 is encapsulated by a package 6 made of resin. A part of each lead 4 inside the package 6 is referred to as an inner lead part 4a, and a part of each lead 4 projecting from a side wall of the package 6 is referred to as an outer lead part 4b. Each of the leads 4 is formed of a lead body 4-1 and a palladium film 7 deposited on the surface of the lead body 4-1. The die-pad 3 is also formed of a die-pad body 3-1 and the palladium film 7 deposited on the surface of the die-pad body 3-1. The lead body 4-1 and the die-pad body 3-1 are made of pure nickel (Ni). The lead body 4-1 and the die-pad body 3-1 are plated with palladium so that the palladium films 7 are formed on the surface thereof.

The palladium film 7 has a thickness in a range of 0.1–1.5 µm. The pure nickel (Ni) of which the lead body 4-1 and the die-pad body 3-1 are made is defined as nickel having a purity equal to or greater than 99%. Hereinafter, the pure nickel is referred to as nickel (Ni) for the sake of simplicity. Nickel (Ni) and palladium (Pd) can be bonded to each other with a high bonding strength. Thus, the palladium films 7 are firmly formed on the surfaces of the lead body 4-1 and the die-pad body 3-1.

The semiconductor device 1 having the above structure is produced as follows.

Figure 2:
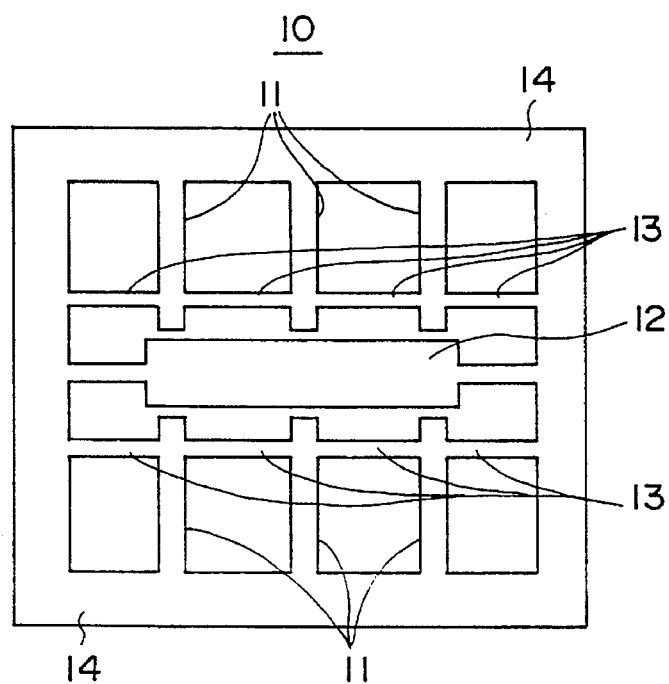
FIG. 2 is a plan view illustrating a lead frame used for producing the semiconductor device shown in FIG. 1.

A lead frame as shown in FIG. 2 is used for producing the semiconductor device 1. Referring to FIG. 2, a lead frame 10 is constituted of lead-portions 11, a die-pad portion 12, tiebars 13 and an outer frame 14. The lead frame 10 is made of nickel (Ni). The present invention can be applied to a semiconductor device having more than 100 pins. However, for the sake of the simplicity, the number of lead portions 11 of the lead frame 10 shown in FIG.2 is only six.

Figure 3:
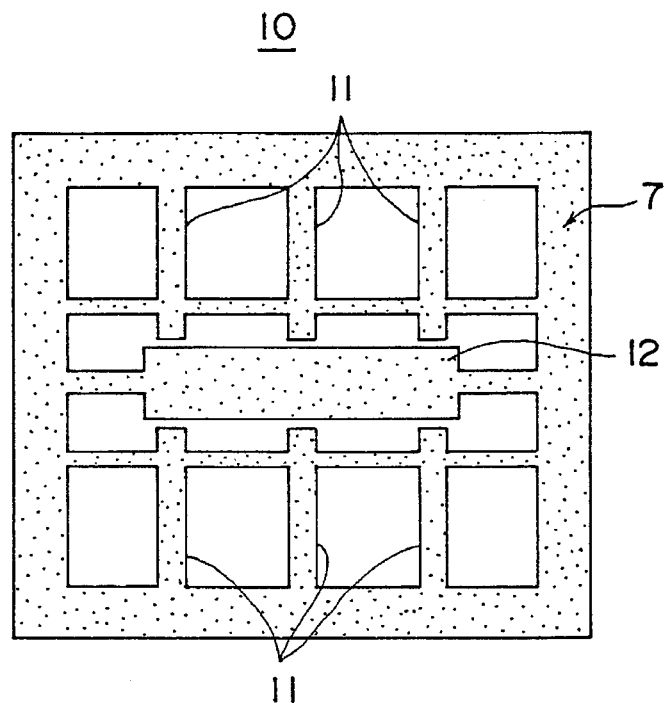
FIG. 3 is a plan view illustrating a lead frame plated with palladium pd).
Figure 4:
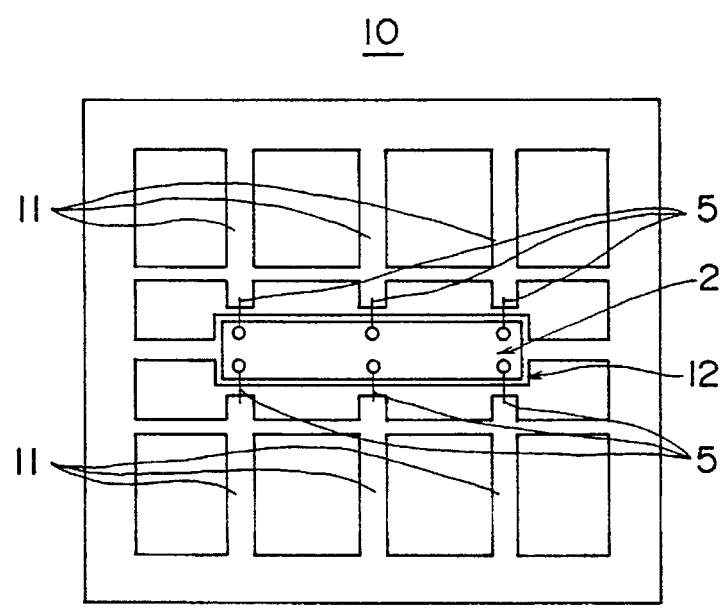
FIG. 4 is a plan view illustrating a lead frame on which a semiconductor device and wires are bonded.

The lead frame 10 as shown in FIG.2 is dipped in a plating bath of palladium (Pd), and a palladium (Pd) plating process is performed. As a result, palladium is plated on the whole surface of the lead flame 10, as shown in FIG.3, so that the palladium film 7 is formed on the surface of the lead frame 10. Referring to FIG.3, the palladium film 7 is indicated by an dotted area. The thickness of the palladium film 7 is controlled to be in a range of 0.1–1.5 µm by controlling the plating time. Next, the semiconductor chip 2 is bonded to the surface of the die-pad portion 12, and a wire 5 is bonded between each of the lead portions 11 and a corresponding one of electrode pads of the semiconductor chip 2 by a wire bonding process.

Figure 5:
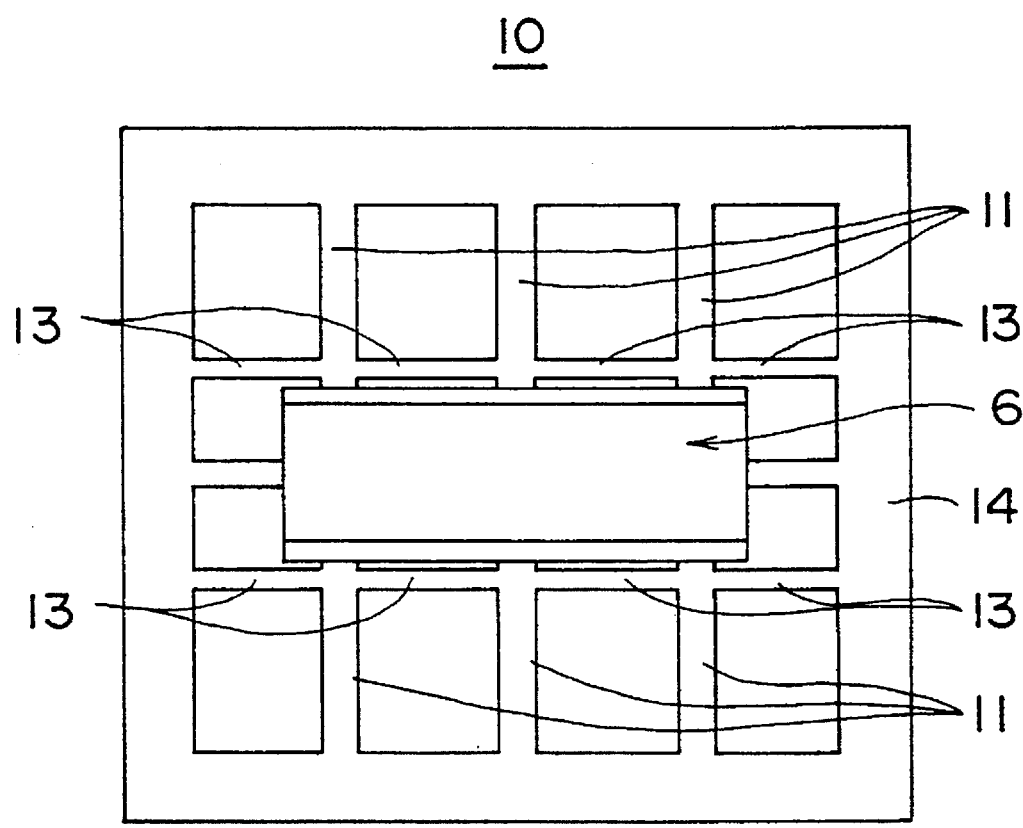
FIG. 5 is a plan view illustrating a lead frame provided with a package encapsulating the semiconductor chip.
Figure 6A:
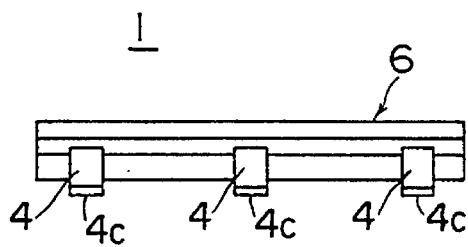
FIG. 6A, 6B and 6C are diagrams illustrating a finished Semiconductor device.
Figure 6B:
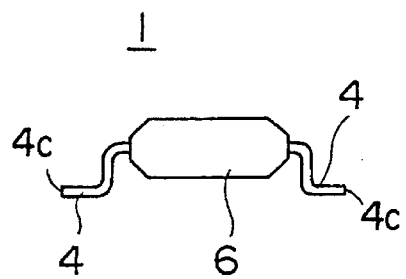
Figure 6C:
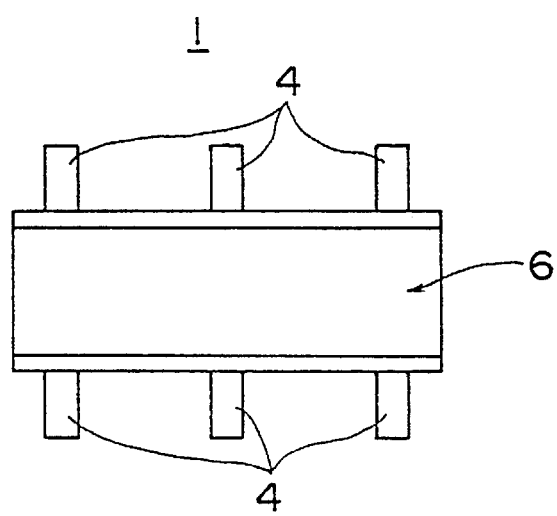

The lead frame 10 provided with the semiconductor chip 2 and wires 5 is set in a molding die of a molding machine. The molding machine supplies resin to the molding die at a predetermined temperature, and a package 6 made of resin is formed in the molding die so as to encapsulate the semiconductor chip 2 and the die-pad portion 12 as shown in FIG.5. Then the lead frame 10 provided with the package 6 is removed from the molding die.

The lead frame 10 provided with the package 6 is set in a cut and bending machine. The cut and bending machine cuts the tiebars 13 and the outer frame 14 so that the tiebars 13 and the outer frame 14 are removed from the lead frame 10. Due to the cutting of the tiebars 13 and the outer frame 14, the leads 4 projecting from the package 6 and the die-pad 3 in the package 6 are formed. Then the leads 4 are bent by the cut and bending machine in a predetermined form. As a result, the semiconductor device 1 is completely formed as shown in FIGS. 1, 6A, 6B and 6C. In the above production process, after the lead frame 10 is plated with palladium, the tiebars 13 and the outer frame are removed by cutting. Thus, a cut surface of the tiebar 13 and a cut surface 4c of a tip end of each lead 4 are not coated by palladium.

In the semiconductor device described above, the palladium film 7 having almost the same characteristics as solder film is formed on the surface of the lead body 4-1 of each of the leads 4. The thickness of the palladium film 7 is within a range of 0.1–1.5 μm, and thus is less than the thickness of the solder film which is in a range of 5–15 μm. Thus, the leads 4 can be easily bent in comparison with conventional leads coated with the conventional solder film. As a result, the accuracy in the dimensions of the leads 4 is improved and the adjacent leads 4 are prevented from being in contact with each other, so that the reliability of the semiconductor device is improved.

In general, the die-pad is plated with silver (Ag). However, there are problems in that sulfuration of silver occurs and migration is inferior. On the other hand, in the present invention, the palladium film 7 is formed on the surface of the die-pad body 3-1, and sulfuration of palladium (Pd) does not occur and the migration is superior to that of silver (Ag). Thus, the semiconductor chip 2 is in a stable state on the die-pad 3.

In addition, the thermal expansion coefficients of nickel (Ni) and palladium (Pd) are respectively approximately $13 \times 10^{-6}$ /deg and $12 \times 10^{-6}$ /deg. The thermal expansion coefficient of the resin of which the package is made is approximately $14 \times 10^{-6}$ /deg. That is, the lead body 4-1, the die-pad 3-1 and the package 6 have respective, similar thermal expansion coefficients. Thus, even if the semiconductor device 1 is heated (in, for example, the molding machine), the palladium films 7 do not scale off the lead body 4-1 and the die-pad body 3-1. Moreover, the thermal stress in the package 6 is small under a condition in which the semiconductor device 1 is heated. Thus, the wires 5 and the package 6 are prevented from breaking and cracking respectively.

In the present invention, the die-pad body 3-1 made of nickel (Ni) does not always need to be plated with palladium (Pd). A semiconductor device having a die-pad in which the die-pad body is plated with silver (Ag) can be normally operated. The characteristics of the semiconductor device having the die-pad in which the die-pad body is plated with palladium (Pd) are superior.

The salt spray test was applied to a plurality of types of semiconductor device. In the salt spray test, sodium chloride aqueous solution (5±1%) was sprayed on each type of semiconductor device at 35° C. for a predetermined testing time. The following types of semiconductor device were tested:

(1) the first type of semiconductor device having leads in which lead bodies are plated with solder (a conventional type);

(2) the second type of semiconductor device having leads in which lead bodies made of 42 alloy are plated with palladium (Pd) (a conventional type);

(3) the third type of semiconductor device having leads in which lead bodies made of copper (Cu) alloy are plated with palladium (Pd) (a conventional type); and (4) the fourth type of semiconductor device having leads in which lead bodies made of nickel (Ni) are plated with palladium (Pd) (according to the present invention).

The results of the salt spray test were obtained as indicated in the following table.

TABLE

| type | testing time | | |
|---|---|---|---|
| | $8^H$ | $24^H$ | $48^H$ |
| (1) | ⊚ | ⊚ | ⊚ |
| (2) | Δ | Δ | X |
| (3) | ○ | Δ | Δ |
| (4) | ⊚ | ⊚ | ⊚ |

Figure 7:
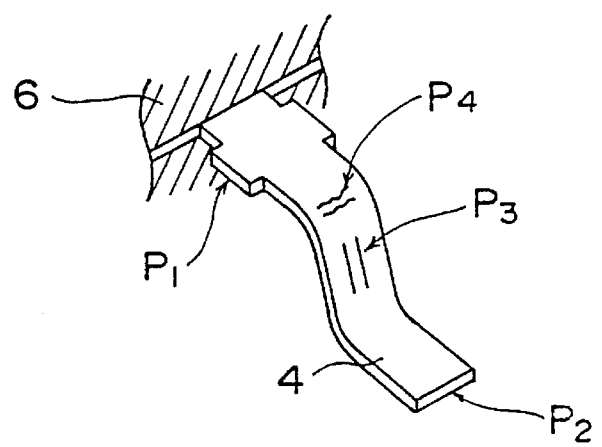
FIG. 7 is a diagram illustrating portions of a lead of a semiconductor device, on each of which portions red rust is generated.

⊚: No problem
○: leads rust slightly
Δ: leads rust overall
X: leads are eaten away with rust In the second and third types of semiconductor device, the rust occurred at the cut surface P1 of the tiebar, the cut surface P2 of the tip of each lead, and scratches P3 and cracks P4 made on each lead in the lead forming process, as shown in FIG. 7. The rust also occurred at portions where the palladium film formed on each lead was too thin. The rust especially occurred at the cut surface P2 of the tip end of each lead.

As indicated in the above table, the leads of the fourth type of semiconductor device did not rust. It is deduced that the leads did not rust because the lead body of the fourth type of semiconductor device (4) is made of nickel (Ni) not including iron (Fe).

According to the first embodiment, the lead body 4-1 and the die-pad body 3-1 are made of nickel (Ni) and the palladium films 7 are formed on the lead body 4-1 and the die-pad body 3-1. Due to this constitution of the leads and the die-pad, the reliability of the semiconductor device 1 can be improved by efficiently using properties of palladium (Pd).

A description will now be given, with respect to FIGS. 8 and 9, of a second embodiment of the present invention.

Figure 8:
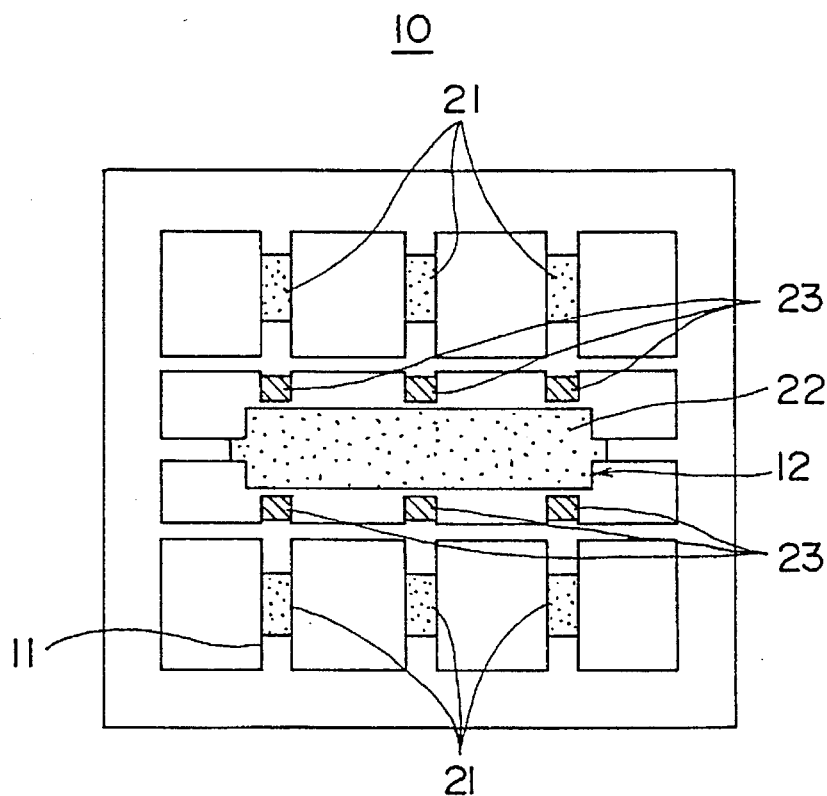
FIG. 8 is a plan view illustrating a lead frame used for producing a semiconductor device according to a second embodiment of the present invention.
Figure 9:
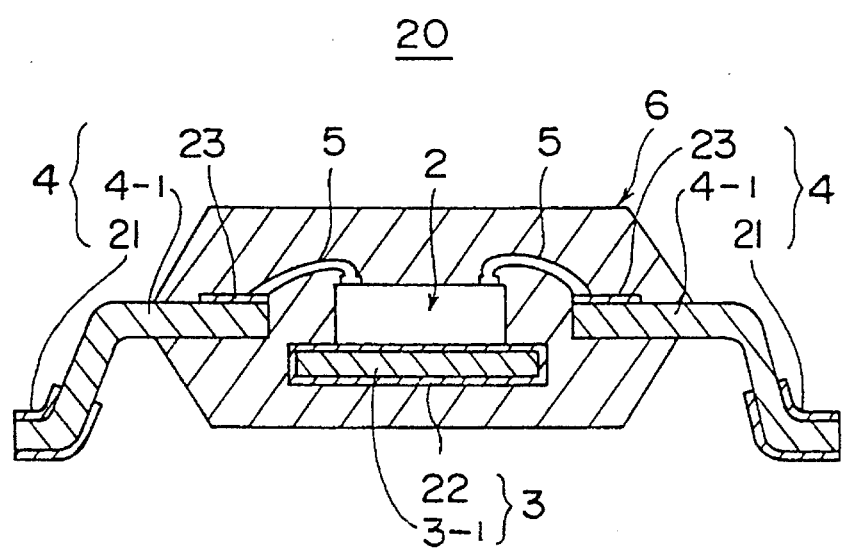
FIG. 9 is a cross sectional view illustrating a semiconductor device according to the second embodiment of the present invention.

FIG. 8 shows a lead frame 10 used for producing a semiconductor device 20 (FIG. 9) according to the second embodiment of the present invention. Referring to FIG. 8, the lead frame 10 made of nickel (Ni) is partially plated with palladium (Pd). Palladium films 21 are formed on those parts of lead portions 11 with which parts solder is in contact, when the leads 4 of the semiconductor device 20 are soldered to a circuit board. The palladium film 22 is also formed on the die-pad portion 12 of the lead frame 10. The thickness of each of the palladium films 21 and 22 is in a range of 0.1–1.5 μm. A plating film 23 made of either silver (Ag) or gold (Au) is formed on an end part of each lead portion 11, to which end part a wire 5 is to be bonded. In a case where the plating film 23 is made of silver (Ag), the thickness of the plating film 23 is in a range of 1.0–10.0 μm. In a case where the plating film 23 is made of gold (Au), the thickness thereof is in a range of 0.1–1.5 μm.

A masking of the lead frame 10 is performed so that the parts on which the palladium films 21 are to be formed are exposed by the mask, and then the masked lead frame 20 is plated with palladium. As a result, the palladium films 21 and 22 are partially formed on the lead frame 10 as shown in FIG. 8. After this, the masking of the lead frame 10 is performed again so that the ends of the lead portions are exposed by the mask, and then the masked lead frame 10 is plated with either silver (Ag) or gold (Au). As a result, the plating portions 23 of either Au or Ag are formed on the ends of the lead portions 11.

The semiconductor device is produced using the lead frame as shown in FIG. 8 in accordance with the same production process as that of the first embodiment described above. As a result, the semiconductor device ass shown in FIG. 9 is obtained.

In the second embodiment, the same advantages as the first embodiment are obtained, and moreover, the amount of palladium used for the palladium films 21 and 22 is decreased. Thus, the production cost of the semiconductor device can be decreased.

A description will now be given, with respect to FIGS. 10 and 11, of a third embodiment of the present invention.

Figure 10:
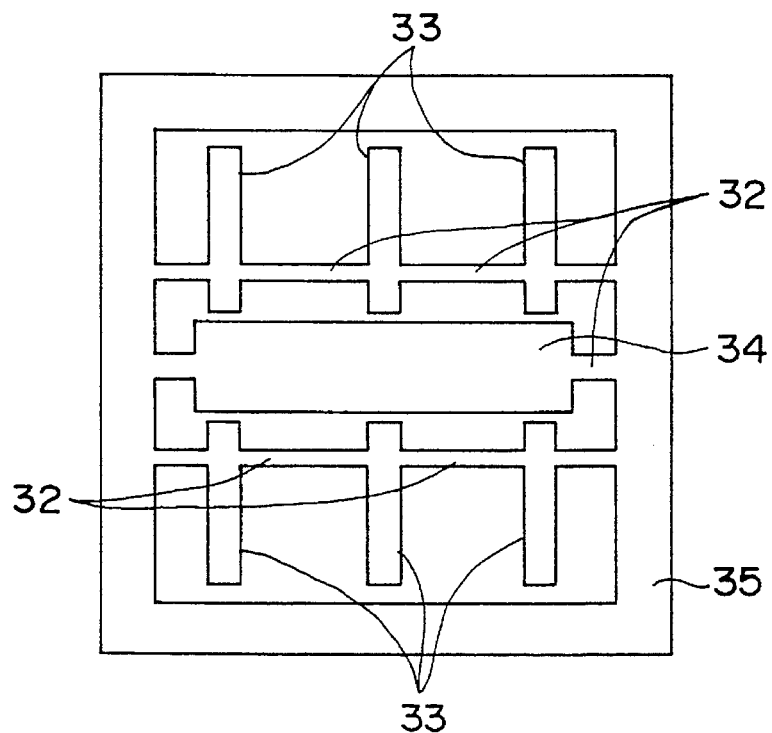
FIG. 10 is a plan view illustrating a lead frame used for producing a semiconductor device according to a third embodiment of the present invention.

FIG. 10 shows a lead frame 31 used for producing a semiconductor device according to the third embodiment of the present invention. Referring to FIG. 10, the ends of the lead portions 33 are separated from an outer frame 35 of the lead frame 31. The lead portions 33 and a die-pad portion 34 are supported by tiebars 32 connected to the outer frame 35. The whole surface of the lead frame 31 made of nickel (Ni) is plated with palladium (Pd).

Figure 11:
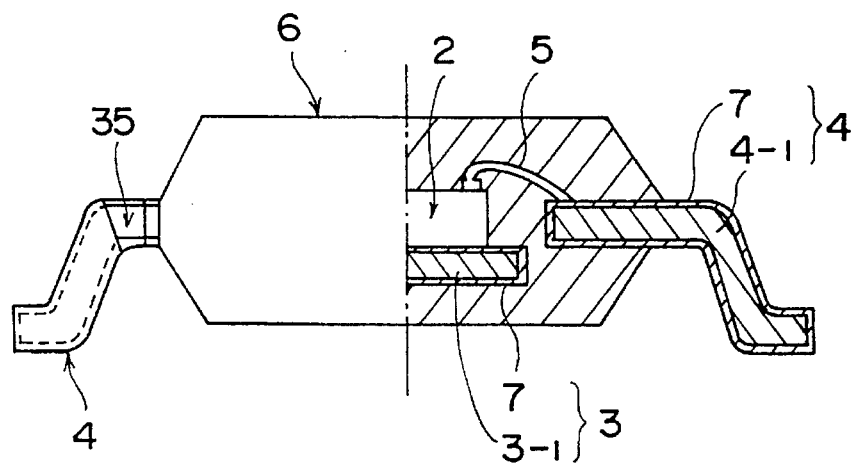
FIG. 11 is a partially sectional view illustrating a semiconductor device according to the third embodiment of the present invention.

Due to use of the lead frame 31 as shown in FIG. 10, a semiconductor device 30 as shown in FIG. 11 is produced in accordance with the same production process as the first embodiment. That is, there is no cut surface at the end of each lead 4, and the end of each lead 4 is covered by palladium. In this case, each cut surface of the tiebar 32 is not covered by palladium.

In the third embodiment, the same advantages as the first embodiment are obtained, and moreover, the area of the lead frame 31 is decreased. Thus, the amount of useless portion of lead frame 31 and the amount of palladium with which the lead frame 31 is to be plated are decreased, so that the production cost of the semiconductor device can be decreased.

A description will now be given, with reference to FIGS. 12 and 13, of a fourth embodiment of the present invention.

Figure 12:
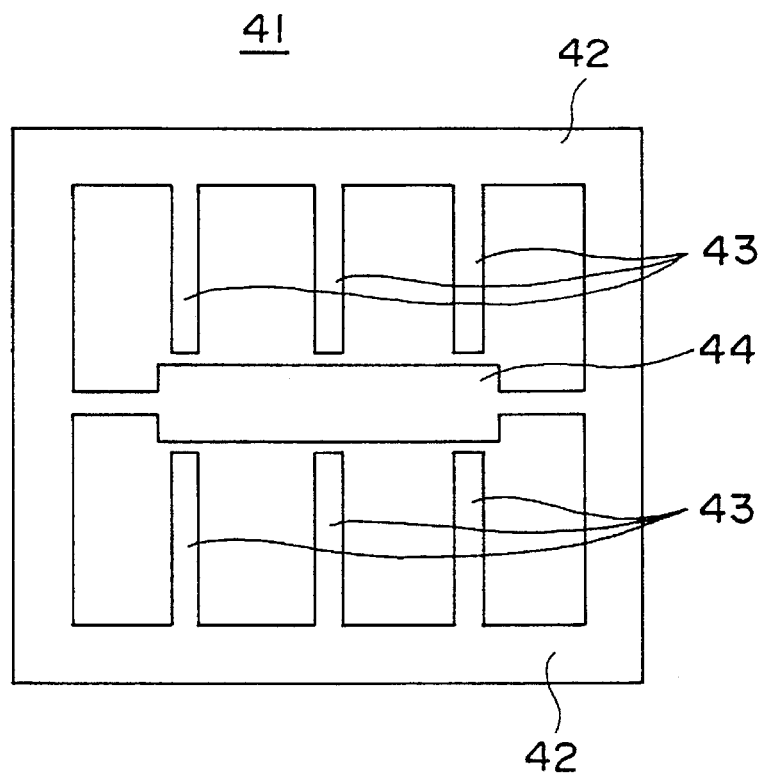
FIG. 12 is a plan view illustrating a lead frame used for producing a semiconductor device according to a fourth embodiment of the present invention.

FIG. 12 shows a lead frame used for producing a semiconductor device according to the fourth embodiment of the present invention. Referring to FIG. 12, there is no tiebar for supporting lead portions 43. The lead portions 43 project from an outer frame 42 to the inside thereof. As the lead frame 41 has no tiebar, intervals at which the leads are arranged can be decreased. Thus, the number of leads (pins) of a semiconductor device can be increased. The whole surface of the lead frame 41 made of nickel (Ni) is plated with palladium (Pd).

Figure 13:
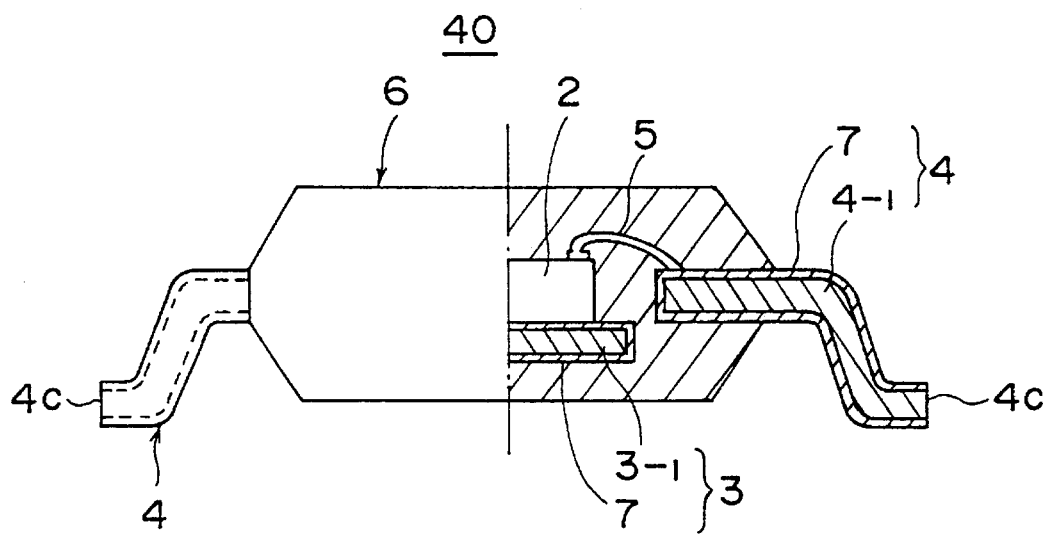
FIG. 13 is a partially sectional view illustrating a semiconductor device according to the fourth embodiment of the present invention.

Due to use of the lead frame 41 as shown in FIG. 12, a semiconductor device 30 as shown in FIG. 13 is produced in accordance with the same production process as the first embodiment. That is, there is no cut surface of the tiebar, and the end 4c of each lead 4 is not covered with palladium.

In the fourth embodiment, the same advantages as the first embodiment are obtained, and moreover, the amount of useless portion of lead frame 41 and the amount of palladium with which the lead frame 31 should be plated are decreased in the same manner as the third embodiment. Thus, the production cost of the semiconductor device can be decreased.

In the above third and fourth embodiments, the lead frames 31 and 41 can be partially plated with palladium (Pd), in the same manner as the second embodiment.

The present invention is not limited to the aforementioned embodiments, and variations and modifications may be made without departing from the scope of the claimed invention.

What is claimed is:

1. A semiconductor device comprising:

a semiconductor chip;

a die-pad on which the semiconductor chip is mounted;

a package encapsulating said die-pad and said semiconductor chip; and a plurality of leads electrically connected to said semiconductor chip and projecting from said package, each of said leads comprising:

a lead body made of pure nickel (Ni) having a purity equal to or greater than 99%, and a first film formed on said lead body, and made of palladium (Pd).

2. A semiconductor device as claimed in claim 1, wherein said first film made of palladium (Pd) has a thickness in the range of 0.1–1.5 μm.

3. A semiconductor device as claimed in claim 1, wherein at least a part of said lead body defines a solder contact surface and at least a part of said first film is formed on the solder contact surface.

4. A semiconductor device as claimed in claim 1, wherein said first film made of palladium (Pd) is formed on the entire surface of said lead body except cut surfaces of said leads, said cut surfaces being formed on each of said leads after forming said first film made of palladium (Pd) on said entire surface of said lead body.

5. A semiconductor device as claimed in claim 1, wherein said package is made of material having a thermal expansion coefficient approximately equal to that of pure nickel (Ni).

6. A semiconductor device as claimed in claim 1, wherein said die-pad comprises a die-pad body made of pure nickel (Ni) having a purity equal to or greater than 99% and a second film formed on the die-pad body and made of palladium (Pd).

7. A semiconductor device as claimed in claim 6, wherein said second film, made of palladium, (Pd) has a thickness in a range of 0.1–1.5 μm.

8. A semiconductor device as claimed in claim 6, wherein said second film made of palladium (Pd) is formed on the whole surface of said die-pad body.

9. A semiconductor device as claimed in claim 6, wherein at least a part of said lead body defines a contact surface to which a wire, connected to said semiconductor chip mounted on said die-pad, is to be bonded and a film made of silver (Ag) is formed on the contact surface.

10. A semiconductor device as claimed in claim 9, wherein said film, made of silver (Ag), has a thickness in a range of 1.0–10 μm.

11. A semiconductor device as claimed in claim 6, wherein at least a part of said lead body defines a contact surface to which a wire, connected to said semiconductor chip mounted on said die-pad, is to be bonded and a film made of gold (Au) is formed on the contact surface.

12. A semiconductor device as claimed in claim 11, wherein said film, made of gold (Au), has a thickness in a range of 0.1–1.5 μm.

13. An electrical lead comprising:

a lead body made of pure nickel having a purity equal to or greater than 99%; and a palladium (Pd) film formed on at least a portion of the lead body.

14. An electrical lead as claimed in claim 13, wherein said film has a thickness in the range of 0.1–1.5 μm.

15. An electrical lead as claimed in claim 13, wherein the electrical lead has improved resistivity to salt spray rusting compared to electrical leads having lead bodies made of an iron-nickel alloy and having a film of palladium (Pd) formed thereon.

16. An electrical lead as claimed in claim 13, wherein the electrical lead has improved resistivity to salt spray rusting compared to electrical leads having lead bodies made of a copper (Cu) alloy and having a film of palladium (Pd) formed thereon.

17. A semiconductor device comprising:

a package comprising a semiconductor chip having at least one electrical lead connected to the semiconductor chip, a portion of each said at least one electrical lead projecting from said package; and each said at least one electrical lead comprises:
a lead body made of pure nickel having a purity equal to or greater than 99%, and
a palladium (Pd) film formed on at least a part of said portion of said lead body.

18. A semiconductor device as claimed in claim 17, wherein said film has a thickness in the range of 0.1–1.5 μm.

19. A semiconductor device as claimed in claim 17, wherein the electrical lead has improved resistivity to salt spray rusting compared to electrical leads having lead bodies made of an iron-nickel alloy and having a film of palladium (Pd) formed thereon.

20. A semiconductor device as claimed in claim 17, wherein the electrical lead has improved resistivity to salt spray rusting compared to electrical leads having lead bodies made of a copper (Cu) alloy and having a film of palladium (Pd) formed thereon.

21. An electrical lead comprising:

a lead body made of pure nickel having a purity equal to or greater than 99%; and
a film formed on at least a portion of the lead body and made of palladium (Pd).

22. An electrical lead as claimed in claim 21, wherein said film has a thickness in the range of 0.1–1.5 μm.

23. An electrical lead as claimed in claim 21, wherein the electrical lead has improved resistivity to salt spray rusting compared to electrical leads having lead bodies made of an iron-nickel alloy and having a film of palladium (Pd) formed thereon.

24. An electrical lead as claimed in claim 21, wherein the electrical lead has improved resistivity to salt spray rusting compared to electrical leads having lead bodies made of a copper (Cu) alloy and having a film of palladium (Pd) formed thereon.

25. A device comprising:

a die pad;

a plurality of leads, each lead comprising an elongated lead body having inner and outer lead parts respectively extending to and defining an inner end and an outer end of the lead body;

a package encapsulating the die pad and the inner lead parts of the plurality of leads with the respective inner ends positioned adjacent to but spaced from corresponding portions of the die-pad; and each of the leads comprising:
a lead body made of pure nickel (Ni) having a purity equal to or greater than 99%, and
a first film, made of palladium (Pd), formed on at least the outer lead part of each lead body and extending outwardly from the encapsulating package.

26. A semiconductor device as claimed in claim 25, wherein said package is made of material having a thermal expansion coefficient approximately equal to that of pure nickel (Ni).

27. A semiconductor device as claimed in claim 26, wherein said die-pad comprises:

a die-pad body made of pure nickel (Ni) having a purity equal to or greater than 99%; and
a second film, made of palladium (Pd), formed on the die-pad body.

28. A semiconductor device as claimed in claim 27, wherein said second film, made of palladium (Pd), has a thickness in a range of 0.1–1.5 μm.

29. A semiconductor device as claimed in claim 27, wherein said second film, made of palladium (Pd), is formed on the whole surface of said die-pad body.

30. A semiconductor device as claimed in claim 27, wherein at least a part of said lead body defines a contact surface to which a wire, connected to said semiconductor chip mounted on said die-pad, is to be bonded and a film made of silver (Ag) is formed on the contact surface.

31. A semiconductor device as claimed in claim 30, wherein said film, made of silver (Ag), has a thickness in a range of 1.0–10 μm.

32. A device as recited in claim 27, wherein a surface portion of each outer lead part defines a contact surface, at least a part of said first film being formed on said contact surface.

* * * * *

UNITED STATES PATENT AND TRADEMARK OFFICE
CERTIFICATE OF CORRECTION

PATENT NO.   : 5,521,432
DATED        : May 28, 1996
INVENTOR(S)  : TSUJI et al.

It is certified that error appears in the above-indentified patent and that said Letters Patent is hereby corrected as shown below:

TITLE PAGE: [56] References Cited:

Under "U.S. PATENT DOCUMENTS" add the following:

4,529,667   07/1985   Shiga et al. ......... 428/646

Under "FOREIGN PATENT DOCUMENTS" add the following:

0 250 146   12/1987   European Pat. Off. ... 257/677

Under "OTHER PUBLICATIONS" add the following:

Abott et al., "Palladium as a Lead Finish for Surface Mount Integrated Circuit Packages," IEEE TRANSACTIONS ON COMPONENTS, HYBRIDS, AND MANUFACTURING TECHNOLOGY, Vol. 14, No. 3, Sept. 1991, pp. 567-572.

Col. 1,   line 12, change "leads, and" to --leads and,--.

Col. 3,   line 19, change "pd)" to --(Pd)--;
        line 26, change "Semiconductor" to --semiconductor--.

Signed and Sealed this

Twenty-seventh Day of August, 1996

Attest:

BRUCE LEHMAN

*Attesting Officer*   Commissioner of Patents and Trademarks